(12) United States Patent
Park

(10) Patent No.: US 8,054,696 B1
(45) Date of Patent: Nov. 8, 2011

(54) SYSTEM AND METHOD TO IMPROVE RELIABILITY IN MEMORY WORD LINE

(75) Inventor: Kee W. Park, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 902 days.

(21) Appl. No.: 12/052,334

(22) Filed: Mar. 20, 2008

(51) Int. Cl.
    *G11C 7/00* (2006.01)
    *G11C 7/10* (2006.01)
    *G11C 29/00* (2006.01)

(52) U.S. Cl. ............. 365/189.11; 365/189.06; 365/201

(58) Field of Classification Search .............. 365/189.11
See application file for complete search history.

(56) References Cited

U.S. PATENT DOCUMENTS

| | | | | |
|---|---|---|---|---|
| 4,513,399 A * | 4/1985 | Tobita | ............ | 365/189.06 |
| 5,689,469 A * | 11/1997 | Asaka et al. | ............ | 365/203 |
| 5,896,340 A * | 4/1999 | Wong et al. | ............ | 365/230.03 |
| 6,160,747 A * | 12/2000 | Brox et al. | ............ | 365/204 |
| 7,170,804 B2 * | 1/2007 | Rehm | ............ | 365/201 |
| 7,184,305 B2 * | 2/2007 | Tanno | ............ | 365/185.09 |
| 7,345,946 B1 * | 3/2008 | Chapman et al. | ............ | 365/230.06 |
| 2007/0165479 A1 * | 7/2007 | Rehm | ............ | 365/230.06 |

* cited by examiner

*Primary Examiner* — Son Mai
(74) *Attorney, Agent, or Firm* — Mahamedi Paradice Kreisman LLP; William L. Paradice, III

(57) ABSTRACT

A method and apparatus are disclosed for improving reliability in a memory circuit. The method includes coupling a pull-down element to a word line, the pull-down element coupled distal to a word line driver. The method further includes, when the word line exhibits a defect causing a first portion of the word line to be electrically isolated from a second portion of the word line, holding the second portion of the word line at a logically low value using the pull-down element. A memory device is disclosed that includes a word line coupled to a memory cell, a word line driver coupled to one end of the word line, and a pull-down element coupled proximate the other end of the word line. The pull-down element is operable, when the word line exhibits a defect causing a first portion of the word line to be electrically isolated from a second portion of the word line, to hold the second portion of the word line at a logical low value.

26 Claims, 8 Drawing Sheets

SYSTEM AND METHOD TO IMPROVE RELIABILITY IN MEMORY WORD LINE

BACKGROUND OF INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), static random access memory (SRAM) and flash memory. The demand for high density semiconductor memory devices increases year after year. Better manufacturing processes have been developed to meet this demand; however, as the density of memory components increases to meet the demand, there is a higher probability of memory errors occurring due to the manufacturing process. Memory errors can corrupt data and result in the permanent loss of business data and lost revenue from downtime.

Built-in self testing (BIST) of the memory device is commonly employed to identify defects that occur during the manufacturing process that may result in memory errors. When a defective memory cell is identified during this testing process, the defective memory cell is conventionally remedied by utilizing redundant memory cells within the memory device. As such, the defective memory cell is repaired by replacing one or more columns or rows containing the defective memory cell with the column or row containing the redundant memory cell. This replacement technique is generally accomplished through the use of fuses. A fuse associated with the defective cell is blown to indicate that the memory cell is defective, and an address presented on the associated row or column is then rerouted to the redundant operational memory cell thereby effectively repairing the cell. With this testing and redundancy method, improved yields in semiconductor storage devices are achieved.

One of the defects that occurs during the manufacturing process is one in which a local word line or a global word line of the memory device experiences an open metal trace or a highly resistive metal trace due to a process defect. When this occurs, a first portion of the word line that connects to the word line driver is electrically separated from a second portion of the word line by this open or highly resistive trace. Redundancy techniques can be used to repair and reroute the memory function. However due to the open trace condition, the second portion of the word line is not electrically connected to the first portion of the word line. As a result, the second portion of the word line is left in a logically floating state. Over time, this floating portion of the word line can become a logical high due to charge accumulation. When the floating portion of the word line is always at a logical high, and therefore always "on," the floating portion can interrupt the correct reading of another row in the memory device, causing a read error. Because the problem occurs as a result of charge accumulation it is typically not discovered until after the product has been shipped to a customer. Moreover, this problem may not be discovered until months or years after the part is delivered to the customer. This potential for a read error to occur presents a significant reliability problem for the memory device.

Accordingly, what is needed in the art is a system and method to improve the reliability of a memory device by controlling the floating portion of a word line resulting from an open or highly resistive trace present in the word line due to a process defect.

SUMMARY OF INVENTION

The present invention is advantageous because it improves the reliability of a memory device by effectively controlling the floating portion of a word line resulting from an open or highly resistive trace present in the word line due to a process defect. Other objects and advantages of the invention will become apparent upon reading the following detailed description and upon reference to the accompanying drawings.

A method for improving reliability in a memory circuit is disclosed in which a pull-down element is coupled to each word line distal to the word line driver. When the word line exhibits a defect that causes a first portion of the word line to be electrically isolated from a second portion of the word line, the pull-down element holds the second portion of the word line at a logical low value.

In another aspect of the present invention a memory device is disclosed that includes a word line coupled to a memory cell, a word line driver coupled to one end of the word line and a pull-down element coupled proximate the other end of the word line. The pull-down element is operable, when the word line exhibits a defect causing a first portion of the word line to be electrically isolated from a second portion of the word line, to hold the second portion of the word line at a logical low value.

In yet another aspect of the present invention an SRAM device is disclosed that includes a plurality of SRAM memory cells, a plurality of word line drivers and a plurality of word lines. Each of the word lines in the plurality of word lines are electrically coupled to one of the plurality of SRAM memory cells. The SRAM device also includes a plurality of pull-down elements, each of the word lines coupled on one end to one of the plurality of word line drivers and coupled on the other end to one of the plurality of pull-down elements.

Various pull-down elements are within the scope of the present invention, including a resistor coupled between the end of the word line and an electrical ground; a switching element coupled between the end of the word line and an electrical ground; a pull-down transistor between the end of the word line and an electrical ground; and a resistor in series with a switching element coupled between the end of the word line and an electrical ground.

In the event that a word line is separated by an open or a highly resistive trace, the methods and apparatus of the present invention prevent charge accumulation on the portion of the word line that connects to the pull-down element. Thereby, read errors that can occur as a result of charge accumulation on the portion of the word line that connects to the pull-down element are avoided, improving the reliability of the memory device. These and other advantages of the present invention will no doubt become apparent to those of ordinary skill in the art after having read the following detailed description of the preferred embodiments, that are illustrated in the various drawing figures.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
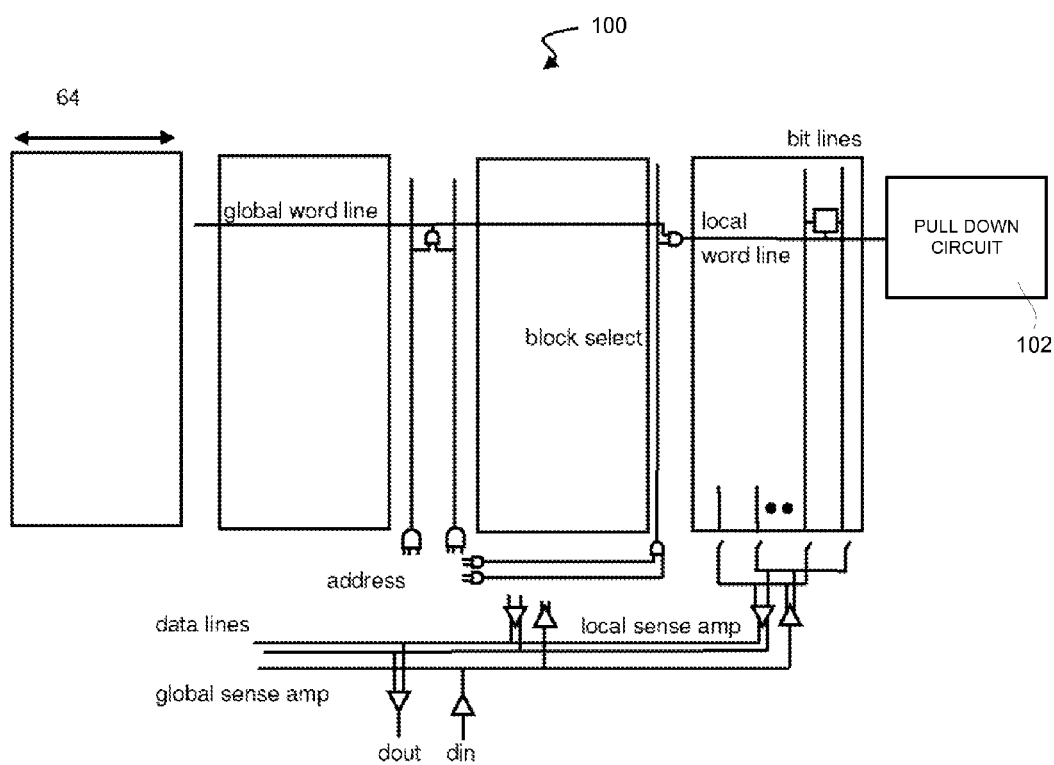
FIG. 1 is a diagram that shows a static random access memory device that includes a pull-down element coupled to the end of each word line in accordance with an embodiment of the present invention.

FIG. 1 illustrates the architecture of an Static Random Access Memory (SRAM) 100. SRAM 100 includes a decoder, which is the portion from the address input to the word lines, and the output mux, which is the portion from the cells to the output. In the case of a read access, the address input is decoded by the decoder to activate a specific word line. In this embodiment, the decoder employs a divided word line structure in which part of the address is decoded to activate the horizontal global word line, and the remaining address bits activate the vertical block select line. The intersection of these two activates the local word line. The circuitry that drives the global word line and the local word line is typically referred to as a word line driver. The cells connected to this local word line then transfer their data onto the bit lines. Data from a subset of these bit lines is then routed by the column mux to the sense amplifiers, which amplify the signal and drive it onto the data lines. The signals from these data lines are then amplified by the global sense amplifier and then output from the memory device.

Continuing with FIG. 1, a pull-down circuit 102 connects to each word line. In the event that a word line is separated by an open or a highly resistive trace, a pull-down element in pull-down circuit 102 is operable to prevent charge accumulation on the portion of the word line that connects to pull-down circuit 102. Thereby, read errors that can occur as a result of charge accumulation on the portion of the word line that connects to pull-down circuit 102 are avoided, improving the reliability of SRAM 100.

Figure 2:
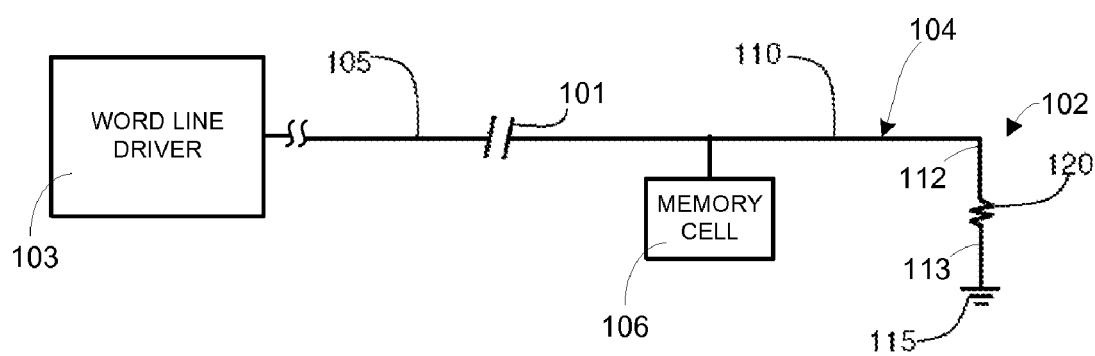
FIG. 2 is a diagram that shows a word line that is coupled on one end to a word line driver and coupled on the other end to a pull-down circuit, where the pull-down element is a resistor in accordance with an embodiment of the present invention.

FIG. 2 shows an embodiment in which pull-down circuit 102 utilizes a highly resistive element 120 as a pull-down element. In the present embodiment a word line driver 103 connects to one end of word line 104 and pull-down circuit 102 connects to the opposite end of word line 104. The end of word line 104 that that connects to pull-down circuit 104 is distal to the origin of word line 104, and may be referred to hereinafter as the "distal" end of word line 104. Thus, in the present embodiment pull-down circuit 102 connects to the word line distal to word line driver 103.

Word line 104 connects to memory cell 106 for performing read and write operations of memory cell 106. In the present embodiment memory cell 106 is a SRAM memory cell. However, alternatively, memory cell 106 can be a different type of memory cell.

Continuing with FIG. 2, in addition to highly resistive element 120, pull-down circuit 102 includes a first short wiring segment 112 and a second short wiring segment 113. Short wiring segment 112 connects on one end to the end of word line 104 and connects on the other end to highly resistive element 120. Short wiring segment 113 connects on one end to the other end of highly resistive element 120 and connects on the other end to electrical ground 115. Thereby, highly resistive element 120 is electrically coupled to electrical ground 115. In the present embodiment word line 104 is a local word line. However, alternatively, word line 104 can be a global word line.

Continuing with FIG. 2, a manufacturing defect can create an open or highly resistive section in word line 104, illustrated as open trace 101 in word line 104. This results in a first portion 105 of word line 104 that is electrically isolated from a second portion 110 of word line 104. The defect can be a process related defect from the manufacturing process that forms SRAM 100, such as, for example, a lithography related defect or a defect resulting from over-etch of a metal layer.

As a result of the electrical isolation of second portion 110 of word line 104 from first portion 105 of word line 104, if testing of the memory device identifies the word line as being defective and subsequently disables the word line and substitutes a redundant word line to repair the memory, disabling the word line only results in disablement of first portion 105 of word line 104.

Because highly restive element 120 is coupled between the end of word line 104 and electrical ground second portion 110 of word line 104 is no longer left in a floating state. Instead, second portion 110 of word line 104 is coupled through highly resistive element 120 to ground, which will hold second portion 110 of word line 104 at a logical low state. Accordingly, charge accumulation on second portion 110 of word line 104 is prevented, assuring that second portion 110 of word line 104 will not interfere with subsequent read and write operations of SRAM memory device 100.

In the present embodiment highly resistive element 120 is a resistor having a high resistance value. Various resistance values for highly resistive element 120 are within the scope of the invention. The resistance should not be too low as to interfere with the global word line and is dependent upon how high the word line driver 103 drives word line 104.

Figure 3:
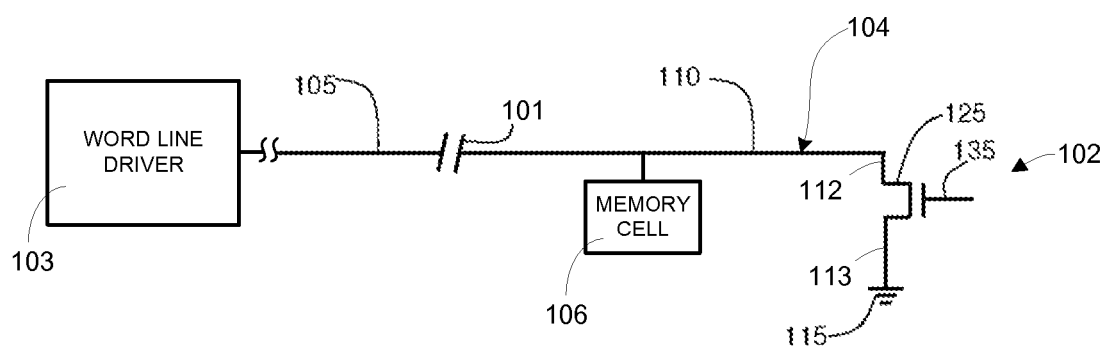
FIG. 3 is a diagram that shows a word line that is coupled on one end to a word line driver and coupled on the other end to a pull-down circuit, where the pull-down element is a transistor in accordance with an embodiment of the present invention.

In an embodiment that is shown in FIG. 3, the pull-down element used to hold second portion 110 of word line 104 at a logical low state is a switch. In the embodiment shown in FIG. 3, the switch is a transistor 125 that is positioned between the end of second portion 110 of word line 104 and electrical ground 115.

Continuing with FIG. 3, in addition to transistor 125, pull-down circuit 102 includes a first short wiring segment 112 and a second short wiring segment 113. Short wiring segment 112 connects on one end to the end of word line 104 and connects on the other end to the source of transistor 125. Short wiring segment 113 connects on one end to the drain of transistor 125 and connects on the other end to electrical ground 115. In the present embodiment word line 104 of FIG. 3 is a local word line. However, alternatively, word line 104 of FIG. 3 can be a global word line.

In the present embodiment, gate 135 of transistor 125 is coupled to a disable signal that is used to disable the word line if the memory cell associated with the word line is identified during testing as being defective and in need of repair via redundancy techniques that are known in the art. As such, when the memory is repaired, word line 104 is disabled using a fuse, but due to the open trace 101 in word line 104, only the first portion 105 of word line 104 is effectively disabled. In the present embodiment the signal used to disable first portion 105 of word line 104 is coupled to gate 135 of transistor 125. Thereby, when first portion 105 of word line 104 is disabled, second portion 110 of word line 104 is pulled to a logical low state using transistor 125. Accordingly, charge accumulation on second portion of the word line 110 is prevented, assuring that second portion 110 of word line 104 will not interfere with subsequent read and write operations of the SRAM memory device.

In an additional embodiment, the pull-down element used to hold second portion 110 of word line 104 at a logical low state is a switch in series with a resistor.

Figure 4:
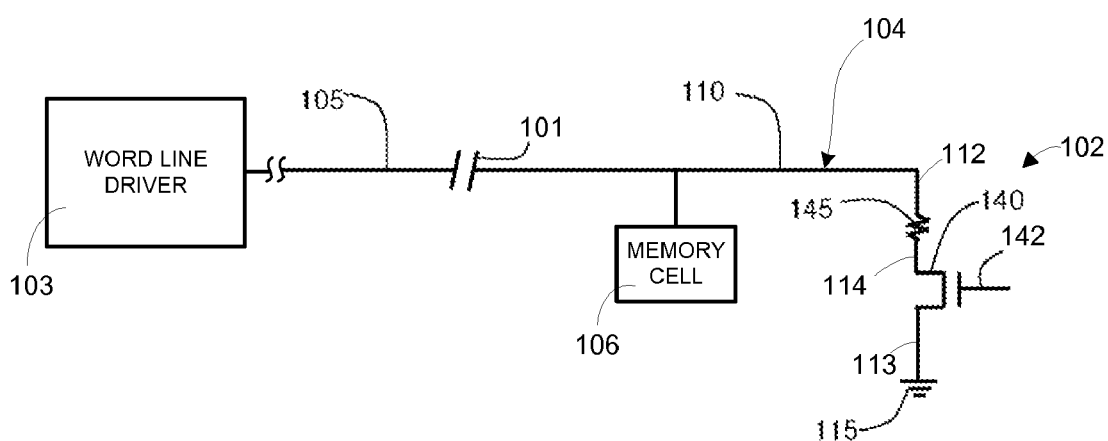
FIG. 4 is a diagram that shows a word line that is coupled on one end to a word line driver and coupled on the other end to a pull-down circuit, where the pull-down element is a resistor in series with a transistor in accordance with an embodiment of the present invention.

With reference to FIG. 4, in a particular embodiment the switch comprises a transistor 140 and a resistor 145. In this embodiment transistor 140 and resistor 145 are positioned in series between the end of second portion 110 of word line 104 and electrical ground 115.

Continuing with FIG. 4, in addition to resistor 145 and transistor 140, pull-down circuit 102 includes a first short wiring segment 112, a second short wiring segment 113 and a third short wiring segment 114. Short wiring segment 112 connects on one end to the end of word line 104 and connects on the other end to resistor 145. Short wiring segment 114 connects on one end to the other end of resistor 145 and connects on the other end to the source of transistor 140. Short wiring segment 113 connects on one end to the drain of transistor 140 and connects on the other end to electrical ground 115. In the present embodiment word line 104 shown in FIG. 4 is a local word line. However, alternatively, word line 104 of FIG. 4 can be a global word line.

In this embodiment, the gate 142 of transistor 140 is coupled to a disable signal that is used to disable the word line if the memory cell associated with the word line is identified during testing as being defective and in need of repair via redundancy techniques. As such, when the memory is repaired, word line 104 is disabled using a fuse, disabling the first portion 105 of word line 104. The signal used to disable first portion 105 of word line 104 is coupled to gate 142 of transistor 140 so that when the first portion 105 of word line 104 is disabled, the corresponding second portion 110 of word line 104 is also disabled by pulling second portion 110 of word line 104 to a logical low state using transistor 140 and resistor 145. Accordingly, charge accumulation on second portion 110 of word line 104 is prevented, assuring that the second portion 110 of word line 104 will not interfere with subsequent read and write operations of the SRAM memory device.

In the embodiment shown in FIGS. 1-4 each pull-down circuit 102 is shown to be connected to the end of word line 104. However, pull-down circuit 102 can also be connected to word line 104 at any location proximate the end of word line 104 that is distal to word line driver 103. In one embodiment word line driver 103 connects to one end of word line 104 and pull-down circuit 102 connects to word line 104 proximate the other end of word line 104. Moreover, in FIGS. 2-4 each pull-down circuit is shown to include a short wiring segment 112 that connects on one end to word line 104 and connects on the other end to a pull-down element. It is appreciated that the present invention could be practiced without the use of short wiring segment 112, with each pull-down element (e.g., highly resistive element 120, transistor 125 or resistor 145) directly connected to the end of word line 104.

In one embodiment SRAM device 100 includes a plurality of memory cells 106 that are SRAM memory cells, a plurality of word line drivers 103, and a plurality of word lines 104, where each of word lines 104 are electrically coupled to one of memory cells 106. In addition, SRAM device 100 includes a plurality of pull-down elements 103, each of word lines 104 coupled on one end to a word line driver 103 and coupled on the other end to a pull-down element 102. In one embodiment all of the local word lines in SRAM memory device 100 are coupled to pull-down elements 102. In another embodiment only some of the local word lines in SRAM memory device are coupled to pull-down elements 102.

The embodiments described with reference to FIG. 2, FIG. 3 and FIG. 4 may be employed in both local word lines and global word lines. In the case of global word lines, if a defective memory cell is identified during testing, the associated row is disabled causing the second portion of the global word line associated with the block of cells to be pulled-down to a logical low state as described. As such, any failure within a block of cells that the global word line is associated with will cause the pull-down of the second portion of the global word line if a repair within the block of cells is required.

Figure 5:
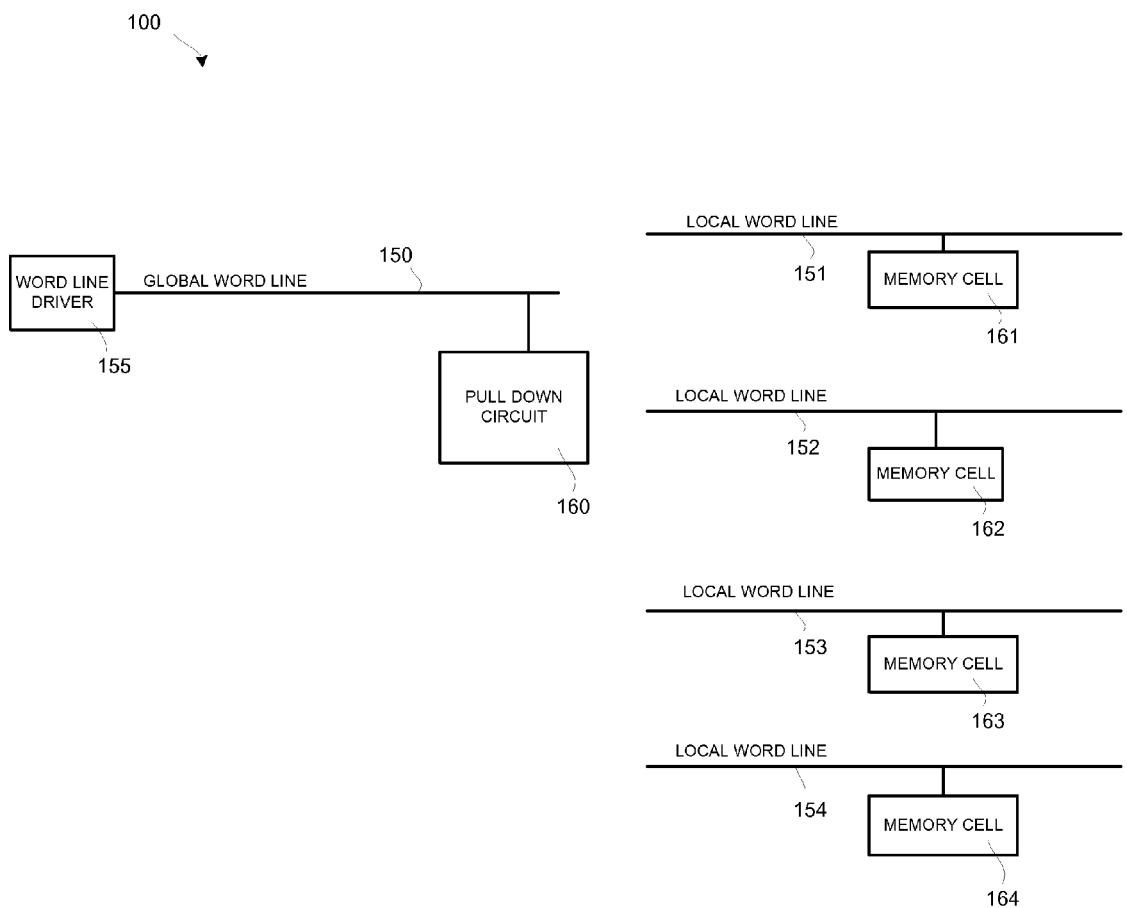
FIG. 5 is a diagram that shows portions of a static random access memory device that includes a global word line and local word lines in a block of word lines that are associated with the global word line in accordance with an embodiment of the present invention, where the global word line is coupled on one end to a word line driver and coupled proximate the other end to a pull-down circuit, where other circuitry of the static random access memory device are not shown in order not to obscure aspects of the present invention.

FIG. 5 shows and embodiment in which a word line driver 155 drives a global word line 150. In this embodiment word line driver 155 is connected to one end of global word line 150 and pull-down circuit 160 is connected to global word line 150 proximate the other end of global word line 150. In the embodiment shown in FIG. 5, local word lines 151-154 are word lines in a block of word lines associated with global word line 150. Local word line 151 is coupled to a memory cell 161; local word line 152 is electrically coupled to memory cell 162; local word line 153 is electrically coupled to memory cell 163; and local word line 154 is electrically coupled to memory call 164.

Pull-down circuit 160 can utilize any of the pull-down elements shown in FIGS. 2-4. In one embodiment pull-down circuit 160 includes a switch (e.g., transistor 125 or 140 shown in FIGS. 3-4) that is operably coupled to the circuits that are operable for disabling each of local word lines 151-154. Accordingly, if any of local word lines 151-154 are disabled, the switch is closed, operating pull-down circuit 160 such that the end of global word line 150 distal to word line driver 155 is maintained at a logical low state.

In one embodiment all of the global word lines 150 in SRAM device 100 are coupled to a pull-down circuit 160. In another embodiment only some of the global word lines 150 in SRAM device 100 are coupled to pull-down circuits 160.

Figure 6:
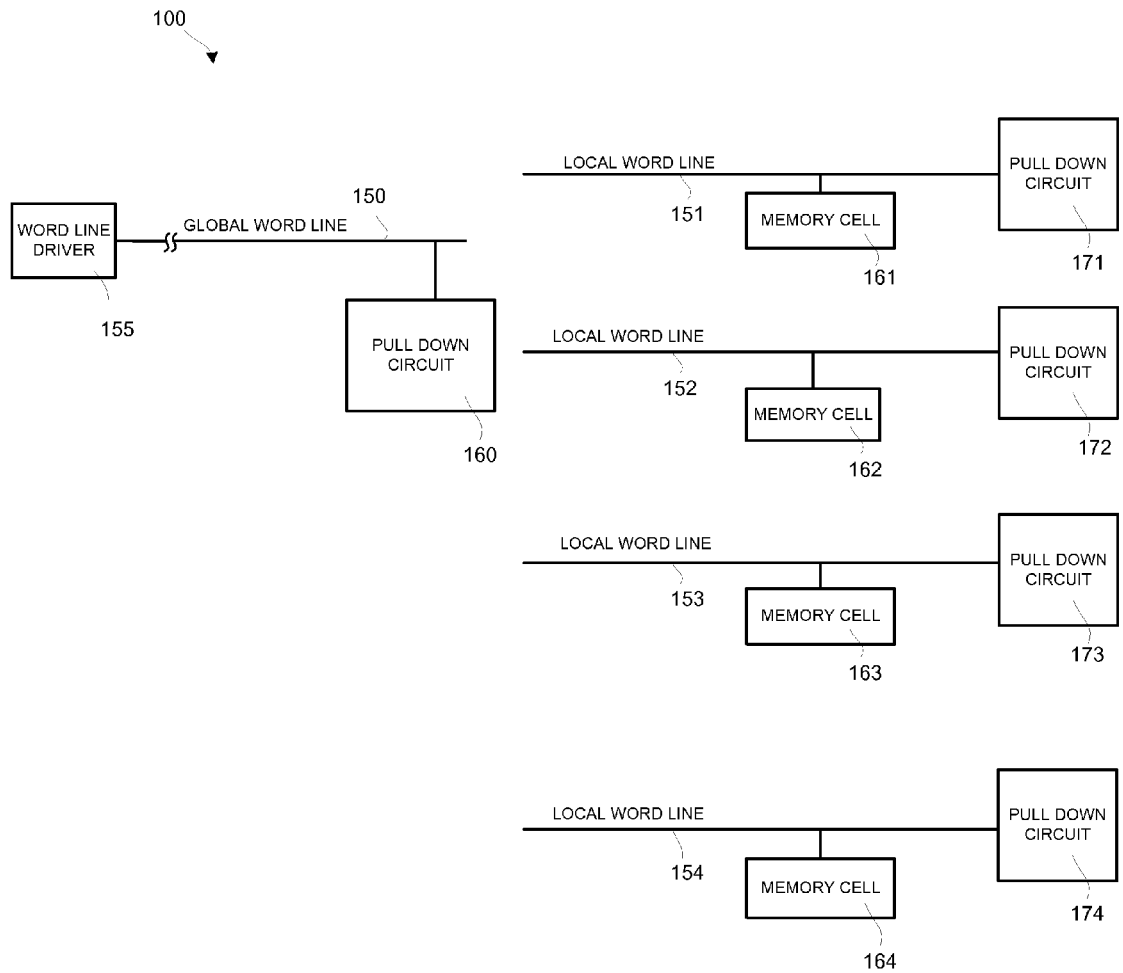
FIG. 6 is a diagram that shows portions of a static random access memory device that includes a global word line and local word lines in a block of word lines that are associated with the global word line in accordance with an embodiment of the present invention, where the global word line is coupled on one end to a word line driver and coupled proximate the other end to a pull-down circuit, and where each of the local word lines are coupled to a word line driver, where other circuitry of the static random access memory device are not shown in order not to obscure aspects of the present invention.

FIG. 6 shows an embodiment in which each local word line 151-154 is coupled to a pull-down circuit 171-174. In the present embodiment pull-down circuit 171 is connected to the end of local word line 151 that is distal to the word line driver of local word line 151; pull-down circuit 172 is connected to the end of local word line 152 that is distal to the word line driver of local word line 152; pull-down circuit 173 is connected to the end of local word line 153 that is distal to the word line driver of local word line 153; and pull-down circuit 174 is connected to the end of local word line 154 that is distal to the word line driver of local word line 154.

As previously discussed with reference to FIG. 5, pull-down circuit 160 can utilize any of the pull-down elements shown in FIGS. 2-4. In one embodiment pull-down circuit 160 of FIG. 6 includes a switch (e.g., transistor 125 or 140 shown in FIGS. 3-4) that is operably coupled to the circuits that are operable for disabling each of local word lines 151-154. Accordingly, if any of local word lines 151-154 are disabled, the switch is closed, operating pull-down circuit 160 such that the end of global word line 150 distal to word line driver 155 is maintained at a logical low. In addition, when one or more of local word lines 151-155 are disabled, pull-down circuits 171-174 will maintain the end of each respective word line 151-155 that is proximate to a pull-down circuit 171-174 at a logical low value. Accordingly, in the event of an open or highly resistive section in a local word line 151-154 that has been disabled, charge accumulation on the portion of each local word line 151-154 proximate a pull-down circuit 171-174 is prevented, assuring that any disabled word line 151-154 will not interfere with subsequent read and write operations of the SRAM memory device.

In one embodiment all of the global word lines 150 in SRAM device 100 are coupled to a pull-down circuit 160 and all of the local word lines 151-154 in SRAM device 100 are coupled to a pull-down circuit 171-174. In another embodiment only some of the global word lines 150 in SRAM device 100 are coupled to pull-down circuits 160 and only some of the local word lines 151-154 are coupled to a pull-down circuit 171-174.

The methods and apparatus of the present invention are also adapted for use with memory devices in which the word line is active low. In this embodiment each word line is high when not selected and low when selected. In this embodiment, instead of a pull-down circuit (and a pull-down element) being used to bring the end of the word line distal to the word line driver to a logical low state, a pull-up circuit is used (that includes a pull-up element) to bring the end of the word line distal to the word line driver to a logical high state. More particularly, each pull-down circuit 102 shown in FIGS. 1-6 can instead be a pull-up circuit that will include a pull-up element that coupled to the word line distal to the word line driver. The pull-up element can be a transistor and can also include a resistor configured in the manner shown in FIGS. 3-4, with the pull-up element coupling to power supply voltage instead of ground.

Figure 7:
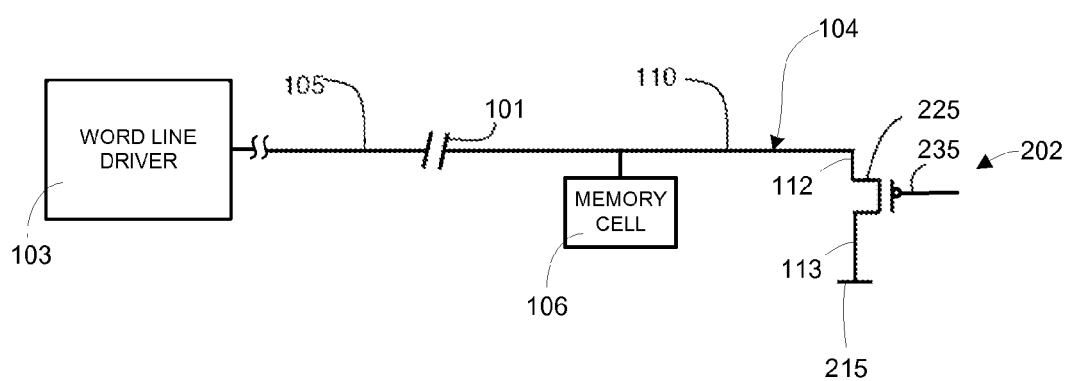
FIG. 7 is a diagram that shows a word line that is coupled on one end to a word line driver and coupled on the other end to a pull-up circuit, where the pull-up element is a transistor in accordance with an embodiment of the present invention.

FIG. 7 shows an exemplary embodiment in which a pull-up element 202 that is used to hold second portion 110 of word line 104 at a logical high state is a switch. In this embodiment the switching element is a pull-up transistor 225 that is a p-channel metal oxide semiconductor (PMOS) transistor coupled on one end to power supply voltage 215 and coupled on the other end to word line 104. transistor 225 includes a gate 235 coupled to the circuit operable to disable word line 104. Thereby, when word line 104 is disabled transistor 225 is operable to pull word line segment 110 to a logical high.

Figure 8:
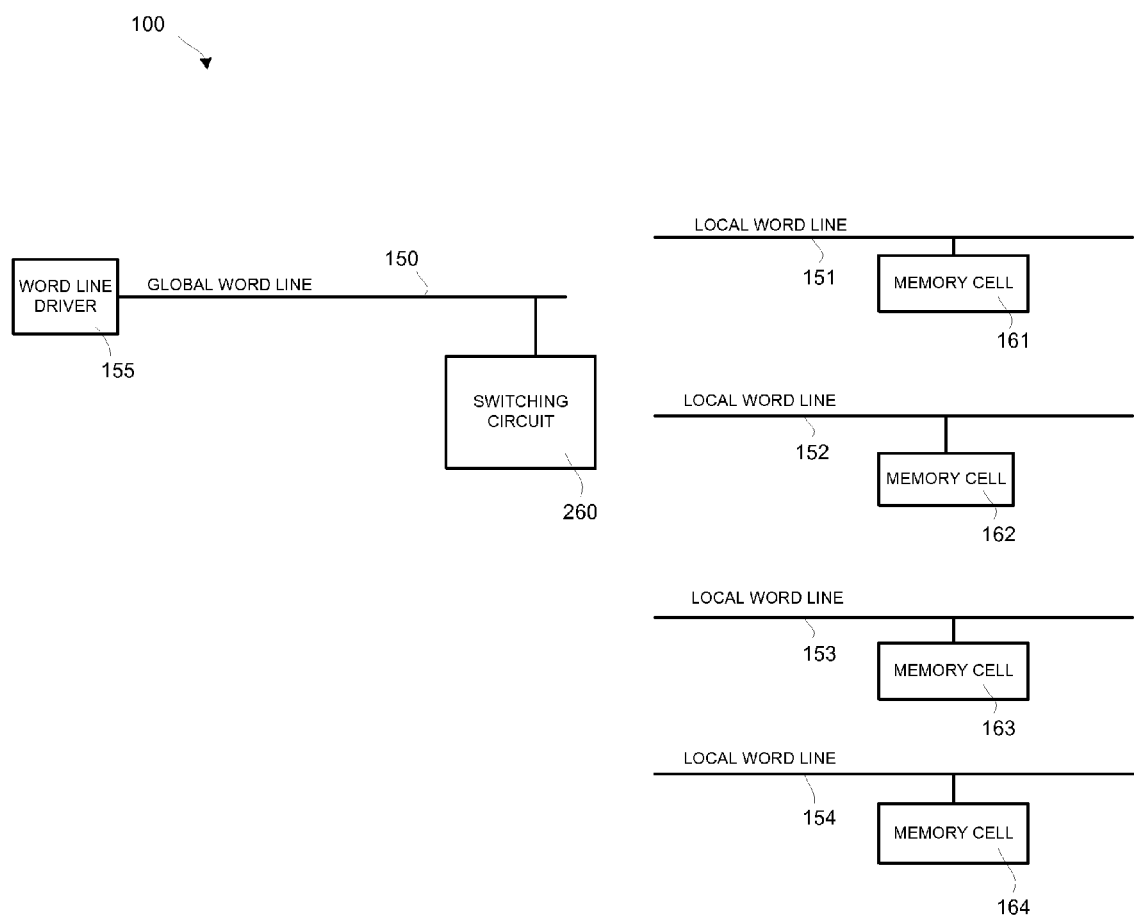
FIG. 8 is a diagram that shows portions of a static random access memory device that includes a global word line and local word lines in a block of word lines that are associated with the global word line in accordance with an embodiment of the present invention, where the global word line is coupled on one end to a word line driver and coupled proximate the other end to a switching circuit, where other circuitry of the static random access memory device are not shown in order not to obscure aspects of the present invention.

FIG. 8 shows an embodiment in which a switching circuit 260 couples proximate the end of global word line 150. Switching circuit 260 includes a switching element that is operable when global word line 150 is deactivated to either pull-up or pull-down global word line 150 to bring the end of global word line 150 to a definite logic state. Thereby, the end of global word line 150 proximate switching circuit 160 will not be in a floating state. More particularly, when global word line 150 is an active low word line, the switching element in switching circuit 260 brings global word line 150 to logical high (as illustrated in FIG. 7) when global word line 150 is deactivated. When global word line 250 is an active high word line (as illustrated in FIGS. 3-4) switching circuit 260 brings global word line 150 to a logical low state. Accordingly, the switching element in switching circuit can be one or more of the pull-up or pull-down elements shown in FIGS. 1-7, including but not limited to the switches formed by transistors 125 and 225.

In the same manner discussed with reference to FIG. 8, a switching circuit 260 can be coupled to the end of each word line. In one embodiment a switching circuit 260 couples to the end of each word line in SRAM device 100 shown in FIG. 1 (instead of pull-down circuit 102). In this embodiment each switching circuit will include a switching element (e.g., switches 125, 225) that is operable when a word line is deactivated to either pull-up or pull-down word line to bring the end of the word line to a definite logic state. More particularly, when the word line is an active low word line, the switching element will bring the word line to logical high (as illustrated in FIG. 7) when the word line is deactivated. When the word line is an active high word line (as illustrated in FIGS. 3-4) the switching element brings the word line to a logical low state. Accordingly, the switching element in switching circuit can be one or more of switching elements shown in FIGS. 3-4 and 7, including but not limited to the switches formed by transistors 125 and 225.

Moreover, in one embodiment both global word line 150 and each of word lines 151-154 shown to FIG. 8 couple to switching circuits. In this embodiment, instead of a pull-down circuit, the end of each local word line 151-154 is connected to a switching circuit 260 that includes a switching element operable to pull-up or pull-down the respective word line 151-154.

The preferred embodiment of the present invention is thus described. While the present invention has been described in particular embodiments, it should be appreciated that the present invention should not be construed as limited by such embodiments, but rather construed according to the following claims.

What is claimed is:

1. A method for improving reliability in a memory circuit, the method comprising:
   coupling a pull-down element to a word line, the pull-down element coupled to the word line distal to a word line driver; and
   when the word line exhibits a defect causing a first portion of the word line to be electrically isolated from a second portion of the word line, holding the second portion of the word line at a logical low value using the pull-down element.

2. The method of claim 1, wherein the word line is coupled to a static random access memory cell.

3. The method of claim 1, wherein the word line driver is coupled to one end of the word line, the pull-down element is coupled proximate the other end of the word line, and wherein the pull-down element comprises a resistor that is coupled between the other end of the word line and an electrical ground.

4. The method of claim 1, wherein the word line driver is coupled to one end of the word line, the pull-down element is coupled proximate the other end of the word line, and wherein the pull-down element comprises a switching element that is coupled between the other end of the word line and an electrical ground.

5. The method of claim 1, wherein the word line driver is coupled to one end of the word line, the pull-down element is coupled proximate the other end of the word line, and wherein the pull-down element comprises a pull-down transistor that is coupled between the other end of the word line and an electrical ground.

6. The method of claim 5, further comprising coupling a disable signal used to disable the word line when the defect is identified during a testing phase to a gate of the pull-down transistor such that, if the word line is disabled, the pull-down transistor is turned on to pull the second portion of the word line to electrical ground.

7. The method of claim 1, wherein the word line driver is coupled to one end of the word line, the pull-down element is coupled proximate the other end of the word line, and wherein the pull-down element comprises a resistor in series with a switching element, the resistor and the switching element coupled between the end of the word line distal to the word line driver and an electrical ground.

8. The method of claim 1, wherein the word line is a local word line.

9. The method of claim 1, wherein the word line is a global word line.

10. The method of claim 1, wherein the word line is a global word line and the method further comprises coupling a disable signal used to disable a local word line within a block of local word lines associated with the global word line when a defect is identified during a testing phase to a gate of a pull-down transistor such that the pull-down transistor is turned on, thereby pulling the second portion of the global word line to electrical ground when any local word line within a block of local word lines associated with the global word line is identified as being defective and is disabled.

11. A memory device comprising:
   a word line coupled to a memory cell;
   a word line driver coupled to one end of the word line; and
   a pull-down element coupled proximate the other end of the word line, the pull-down element operable, when the word line exhibits a defect causing a first portion of the word line to be electrically isolated from a second portion of the word line, to hold the second portion of the word line at a logical low value.

12. The memory device of claim 11, wherein the memory cell is a static random access memory cell.

13. The memory device of claim 12, wherein the pull-down element is a resistor coupled between the other end of the word line and an electrical ground.

14. The memory device of claim 11, wherein the pull-down element is a switching element coupled between the other end of the word line and an electrical ground.

15. The memory device of claim 11, wherein the pull-down element is a pull-down transistor coupled between the other end of the word line and an electrical ground.

16. The memory device of claim 15, wherein a disable signal used to disable the word line when a defect is identified during a testing phase is coupled to a gate of the pull-down transistor such that the pull-down transistor is turned on when the word line is disabled to pull the second portion of the word line to electrical ground.

17. The memory device of claim 12, wherein the pull-down element is a resistor in series with a switching element coupled between the end of the word line and an electrical ground.

18. A SRAM device comprising:
   a plurality of SRAM memory cells;
   a plurality of word line drivers;
   a plurality of word lines, each of the word lines in the plurality of word lines electrically coupled to one of the plurality of SRAM memory cells; and
   a plurality of pull-down elements, each of the word lines in the plurality of word lines coupled on one end to one of the plurality of word line drivers and coupled on the other end to one of the plurality of pull-down elements.

19. The SRAM device of claim 18, wherein each of the plurality of pull-down elements is a resistor coupled between the other end of the word line and an electrical ground.

20. The SRAM device of claim 18, wherein each of the plurality of pull-down elements is a switching element coupled between the other end of the word line and an electrical ground.

21. A method for improving reliability in a memory circuit, the method comprising:
   coupling a switching element to a word line, the switching element coupled to the word line distal to a word line driver; and
   when the word line exhibits a defect causing a first portion of the word line to be electrically isolated from a second portion of the word line, operating the switching element such that the word line is not in a floating state.

22. The method of claim 21, wherein the switching element is operable to hold the second portion of the word line at a logical high value using a pull-up element.

23. The method of claim 22, wherein the word line is a global word line.

24. A memory device comprising:
   a word line coupled to a memory cell;
   a word line driver coupled to one end of the word line; and
   a switching element coupled proximate the other end of the word line, the switching element operable, when the word line exhibits a defect causing a first portion of the word line to be electrically isolated from a second portion of the word line, to hold the second portion of the word line at a predetermined logic state.

25. The memory device of claim 24, wherein the memory cell is a static random access memory cell and the logic state is a logical high.

26. The memory device of claim 24, wherein the logic state is a logical low.

* * * * *